United States Patent [19]
Tsukude

[11] Patent Number: 5,982,698
[45] Date of Patent: Nov. 9, 1999

[54] MULTI-BANK SYSTEM SEMICONDUCTOR MEMORY DEVICE CAPABLE OF OPERATING AT HIGH SPEED

[75] Inventor: Masaki Tsukude, Hyogo, Japan

[73] Assignee: Mitsubishi Denki Kabushiki Kaisha, Tokyo, Japan

[21] Appl. No.: 09/215,927

[22] Filed: Dec. 18, 1998

[30] Foreign Application Priority Data

Jul. 14, 1998 [JP] Japan ................................ 10-198864

[51] Int. Cl.⁶ ........................................................ G11C 8/00
[52] U.S. Cl. .................. 365/230.03; 365/63; 365/230.06
[58] Field of Search ............................... 365/230.03, 51, 365/63, 230.06, 235

[56] References Cited

U.S. PATENT DOCUMENTS

| | | | |
|---|---|---|---|
| 5,594,704 | 1/1997 | Konishi et al. | 365/230.03 |
| 5,781,495 | 7/1998 | Arimoto | 365/230.03 |
| 5,825,710 | 10/1998 | Jeng et al. | 365/230.03 |
| 5,848,009 | 12/1998 | Lee et al. | 365/230.03 |
| 5,903,514 | 5/1999 | Sawada | 365/230.03 |

FOREIGN PATENT DOCUMENTS 9-306163  11/1997  Japan.
10-040682   2/1998  Japan.

Primary Examiner—Son T. Dinh
Attorney, Agent, or Firm—McDermott, Will & Emery

[57] ABSTRACT

A semiconductor integrated circuit device of the present invention includes a plurality of banks and a plurality of sense amplifier bands. A switch circuit included in each sense amplifier band receives a signal on a transmission line and outputs a signal read from the bank to a global data input/output line arranged in the column direction. A column bank control circuit for outputting a column bank control signal is arranged on the column decoder side. The column bank control signal is supplied to the transmission line through a column bank control signal line arranged in the column direction. The switch circuit operates in accordance with the column bank control signal. By such a configuration, a column-related operation can be matched easily.

15 Claims, 13 Drawing Sheets

MULTI-BANK SYSTEM SEMICONDUCTOR MEMORY DEVICE CAPABLE OF OPERATING AT HIGH SPEED

BACKGROUND OF THE INVENTION

1. Field of the Invention

The present invention relates to a semiconductor memory device and more specifically to a multi-bank system semiconductor memory device.

2. Description of the Background Art

As recent approaches to achieve higher speed of dynamic random access memories (DRAMs), the method of improving the transfer rate of data by accessing the data at a high frequency and the method of improving latency are used.

Since access to row circuitry is especially several times as slow as access to column circuitry in the DRAMs, considerable latency is required when the row circuitry is not activated. In recent years, therefore, the row circuitry has been divided into several banks to increase hit ratio at a row-related activated bank. Thus, such delay in latency as caused by the system has been eliminated and apparent performance of the DRAMs has been improved. The more the number of banks, the higher the performance in this case. However, several drawbacks are caused.

A conventional multi-bank system semiconductor memory device 9000 will be described in the following with reference to FIG. 11. FIG. 11 representatively shows an example where row circuitry is divided into sixteen banks. In the figure, reference numbers 5, 6 and 9 denote a 2-bit global data input/output line, a local data input/output line and a transmission line for transmitting a column bank control signal described below. Further, reference number 8 denotes part of a dividing region 15 described below.

Conventional semiconductor memory device 9000 includes a plurality of banks 10#0, 10#1, 10#2, . . . , 10#15 and a plurality of sense amplifier bands 20#0, 20#1, 20#2, . . . , 20#15, 20#16 and has the configuration of a shared sense amplifier type. The banks can operate independently from one another. The banks each include a plurality of memory cell arrays.

Conventional semiconductor memory device 9000 further includes, a column bank control circuit 100, a column-related control circuit 102, a row-related/row bank control circuit 104 and a row decoder 106.

Column-related control circuit 102 includes a column decoder, a write.read buffer and so on. A read signal from each memory cell array is transmitted from global data input/output line 5 to column-related control circuit 102 and processed.

The sense amplifier bands each include a plurality of sense amplifiers. A read signal from a memory cell is amplified by a sense amplifier and transmitted to local data input/output line 6 that is arranged in the word line direction (row direction).

A signal on local data input/output line 6 is transmitted to global data input/output line 5 that is arranged in the direction of a column selection line (column direction). Global data input/output line 5 is arranged commonly to the same column in a plurality of banks.

Which bank and global data input/output line 5 are connected together is controlled in accordance with a column-related active signal (more specifically, a column bank control signal). Column bank control circuit 100 supplies, in accordance with a column-related bank address, the column bank control signal to transmission line 9 that runs on a sense amplifier band.

Here, the relations between the sense amplifier band and the banks will be described in detail with reference to FIG. 12.

In FIG. 12, bank 10#0 and corresponding sense amplifier band 20#0 are shown as an example. Bank 10#0 includes a plurality of memory cell arrays 12 divided corresponding to a plurality of columns. Memory cell arrays 12 are separated from one another by sub decode bands (in the case of a divided word line configuration) or pile-driven word line regions 15 (in the case of a word line shunt method, the region is hereinafter referred to as dividing regions 15). Here, reference number 4 denotes a bit line pair.

A specific configuration of the sub decode band will be described with reference to FIG. 13. As shown in FIG. 13, the sub decode band (reference number 15 in the figure) includes a plurality of sub decode circuits 16#0, 16#1, 16#2, . . . , 16#i. The sub decode circuits are arranged corresponding to main word lines MWL#0, MWL#1, MWL#2, . . .

Sub decode circuit 16#0 will be representatively described. Sub decode circuit 16#0 includes AND circuits 17#0, 17#1, 17#2 and 17#3. AND circuits 17#2 and 17#3 output, in response to a signal on main word line MWL#0 and a signal on a sub decode line 18, sub decode signals SWL#10 and SWL#11 for one adjacent memory cell array 12.

AND circuits 17#0 and 17#1 output, in response to a signal on main word line MWL#0 and a signal on sub decode line 18, sub decode signals SWL#00 and SWL#01 for the other adjacent memory cell array 12, not shown.

Referring to FIG. 12, sense amplifier band 20#0 includes a sense amplifier 26, a data input/output-related switch circuit 22 and a sense amplifier-related switch circuit 24. Data input/output-related switch circuit 22 and sense amplifier-related switch circuit 24 are arranged in the row direction.

Data input/output-related switch circuit 22 is arranged at a crossing area of a series of dividing regions 15 in the column direction and a sense amplifier band. Data input/output-related switch circuit 22 directly controls connection of global data input/output line 5 and local data input/output line 6 in accordance with column bank control signal CBS received from transmission line 9. Thus, local data input/output line 6 connected to global data input/output line 5 is selected (a bank is selected).

In the multi-bank system, at least two banks may be activated simultaneously during a certain time period. In this case, column access for another bank may be performed while sense amplifier 26 amplifies the fine width of a signal. When column selection line 7 is activated at this time, data on another bank on the global data input/output line is transmitted to sense amplifier 26 and therefore memory cell data is destroyed.

Accordingly, sense amplifier-related switch circuit 24 is provided to directly control connection of sense amplifier 26 and local data input/output line 6 in accordance with column bank control signal CBS received from transmission line 9. Thus, sense amplifier 26 connected to local data input/output line 6 is selected.

A circuit configuration of data input/output-related switch circuit 22 will be described in the following with reference to FIG. 14. In FIG. 14, global data input/output line 5 is formed of global data input/output lines 5a and 5b, and local data input/output line 6 is formed of local data input/output lines 6a and 6b.

Data input/output-related switch circuit 22 includes gate circuits 23a and 23b and an inverter circuit 21. Inverter circuit 21 inverts column bank control signal CBS received from transmission line 9 and outputs a signal/CBS.

Gate circuit 23a is arranged corresponding to global data input/output line 5a and local data input/output line 6a. Gate circuit 23a transmits a signal on local data input/output line 6a to global data input/output line 5a in response to column bank control signal CBS and signal/CBS.

Gate circuit 23b is arranged corresponding to global data input/output line 5b and local data input/output line 6b. Gate circuit 23b transmits a signal on local data input/output line 6b to global data input/output line 5b in response to column bank control signal CBS and signal/CBS.

In this manner, local data input/output line 6 connected to global data input/output line 5 is selected by column bank control signal CBS corresponding to a bank.

A specific configuration of sense amplifier-related switch circuit 24 will be described in the following with reference to FIG. 15. FIG. 15 also shows the relations with sense amplifier 26.

Sense amplifier-related switch circuit 24 includes NMOS transistors N2a, N2b, N3a and N3b. NMOS transistors N3a and N3b constitute a column selection gate 25.

NMOS transistors N2a and N3a are connected in series between local data input/output line 6a and sense amplifier 26. NMOS transistors N2b and N3b are connected in series between local data input/output line 6b and sense amplifier 26.

NMOS transistors N2a and N2b have their gate electrodes connected to transmission line 9. NMOS transistors N3a and N3b have their gate electrodes connected to column selection line 7.

Column selection gate 25 is opened and closed in response to a signal on column selection line 7. NMOS transistors N2a and N2b are turned on/off in response to column bank control signal CBS received from transmission line 9.

Column selection line 7 selects memory cell array 12 in the column direction, and column bank control signal CBS selects sense amplifier 26 connected to local data input/output line 5.

However, the operation cycle of the column-related circuitry side is several times as fast as that of the row-related circuitry side. In the configuration of the above described conventional semiconductor memory device 9000, therefore, the column bank control signal CBS is transmitted from the row-related circuitry side and thus the timing of the row-related circuitry and column-related circuitry sides is difficult to match. Accordingly, the configuration is not suitable for a high speed operation.

Further, transmission line 9 for transmitting the column bank control signal CBS has a considerable load. In the case of a one-directional input (input in the row direction) from column bank control circuit 100, therefore, the speed of signal transmission is different between switch circuits (the sense amplifier-related switch circuit and the data input/output-related switch circuit) closest to the row decoder and switch circuits farthest from the row decoder. Thus, achievement of higher operating speed is hindered.

SUMMARY OF THE INVENTION

Accordingly, an object of the present invention is to provide a semiconductor memory device allowing easy matching of the operation of column circuitry.

Another object of the present invention is to provide a semiconductor memory device capable of operating at high speed by reducing skew in the operation of column circuitry without increasing a layout area.

A semiconductor memory device according to the present invention includes: a plurality of banks each divided to form a plurality of memory cell arrays corresponding to a plurality of columns; a plurality of sense amplifier blocks arranged corresponding to the plurality of banks; a plurality of data lines arranged in the column direction, the plurality of data lines each provided commonly to a corresponding column in the plurality of banks; a plurality of column selection lines arranged in the column direction, the plurality of column selection lines each provided to select a corresponding column in the plurality of banks; the plurality of sense amplifier blocks each including a plurality of sense amplifiers arranged corresponding to the plurality of columns, a transmission line arranged in the row direction, and a plurality of control circuits for controlling transmission of outputs of the plurality of sense amplifiers to corresponding data lines in response to a signal on the transmission line; a column bank control circuit for generating a control signal to be supplied to the plurality of transmission lines; and a plurality of control signal lines arranged in the column direction, the plurality of control signal lines each supplying the control signal output from the column bank control circuit to a corresponding transmission line.

Accordingly, the present invention is advantageous in that the operation timing of column circuitry can be matched easily by arranging a column bank control signal line for supplying a column bank control signal in the column direction with respect to a transmission line for supplying the column bank control signal to switch circuits arranged in a sense amplifier band. Thus, a high speed operation can be achieved.

Specifically, since the transmission line is directly connected to the column bank control signal line, an increase in the layout area can be suppressed.

Specifically, the column bank control signal line can be arranged by utilizing a dividing area.

Specifically, higher speed of access to column circuitry can be achieved without an area penalty by arranging the column bank control signal line along a series of memory cell arrays.

Specifically, higher speed of a column-related operation can be achieved without a large area penalty by passing the column bank control signal line through a decoder on the column side.

Specifically, skew in the operation timing of switch circuits on a sense amplifier band can be suppressed by connecting a plurality of column bank control signal lines to the transmission lines at prescribed intervals. Thus, higher speed of a column-related operation can be further achieved.

Specifically, a plurality of column bank control signal lines are connected to the transmission lines at prescribed intervals so that the column bank control signals reach the switch circuits almost simultaneously. Accordingly, skew in the operation timing of the switch circuits on a sense amplifier band can be suppressed. Thus, higher speed of a column-related operation can be further achieved.

Specifically, a plurality of column bank control signal lines are connected to the transmission lines at prescribed intervals so as to suppress delay in the operation timing of the switch circuits. Accordingly, skew in the operation timing of the switch circuits on a sense amplifier band can be prevented. Thus, higher speed of a column-related operation can be further achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor memory device in a first embodiment of the present invention will be described. The semiconductor memory device in the first embodiment of the present invention enables higher speed of access to column circuitry in the multi-bank system.

Figure 1:
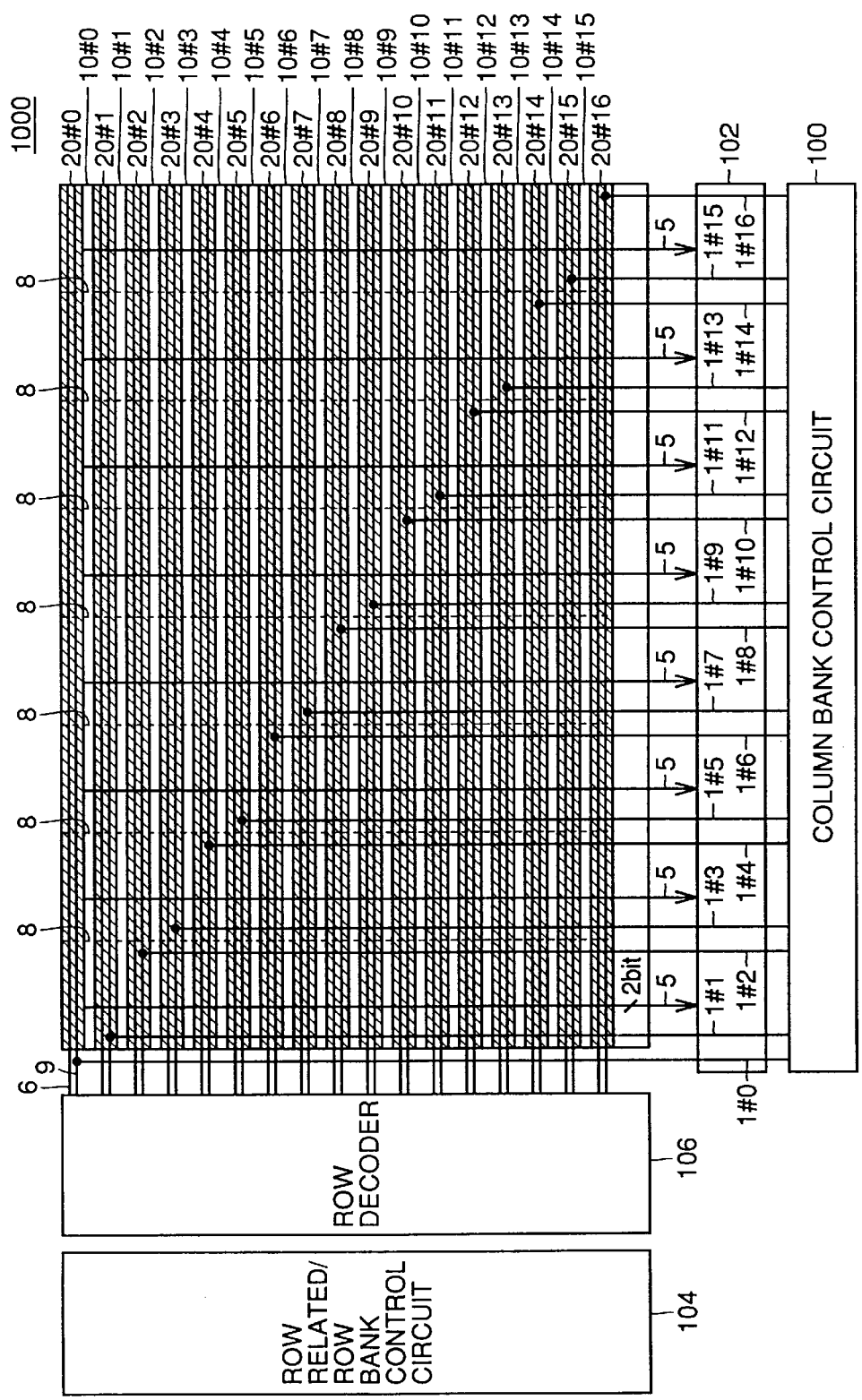
FIG. 1 shows a configuration of a main part of a semiconductor memory device 1000 in a first embodiment of the present invention.

A configuration of a semiconductor memory device 1000 in the first embodiment of the present invention will be described with reference to FIG. 1. FIG. 1 representatively shows the case where row circuitry is divided into sixteen banks. The same elements as conventional semiconductor memory device 9000 are denoted by the same reference characters and numbers and their description will not be repeated.

Semiconductor memory device 1000 shown in FIG. 1 is different from conventional semiconductor memory device 9000 in that a column bank control circuit 100 for generating column bank control signals is arranged on the side of a column-related control circuit 102 including a column decoder and the column bank control signals are supplied to corresponding transmission lines 9 by column bank control signal lines 1#0, 1#1, 1#2, 1#3, . . . , 1#14, 1#15, 1#16 arranged in the column direction in semiconductor memory device 1000 shown in FIG. 1.

Column bank control circuit 100 shown in FIG. 1 is arranged parallel to a series of a plurality of banks. Column bank control circuit 100 generates the column bank control signals corresponding to sense amplifier bands 20#0, 20#1, 20#2, . . . , 20#15, 20#16 and outputs them to column bank control signal lines 1#0, 1#1, 1#2, 1#3, . . . , 1#14, 1#15, 1#16 arranged in the column direction. The column bank control signal lines are connected to transmission lines 9 arranged in the row direction.

The relations between transmission lines 9 and column bank control signal lines 1#0 . . . will be described in the following with reference to FIG. 2.

Figure 2:
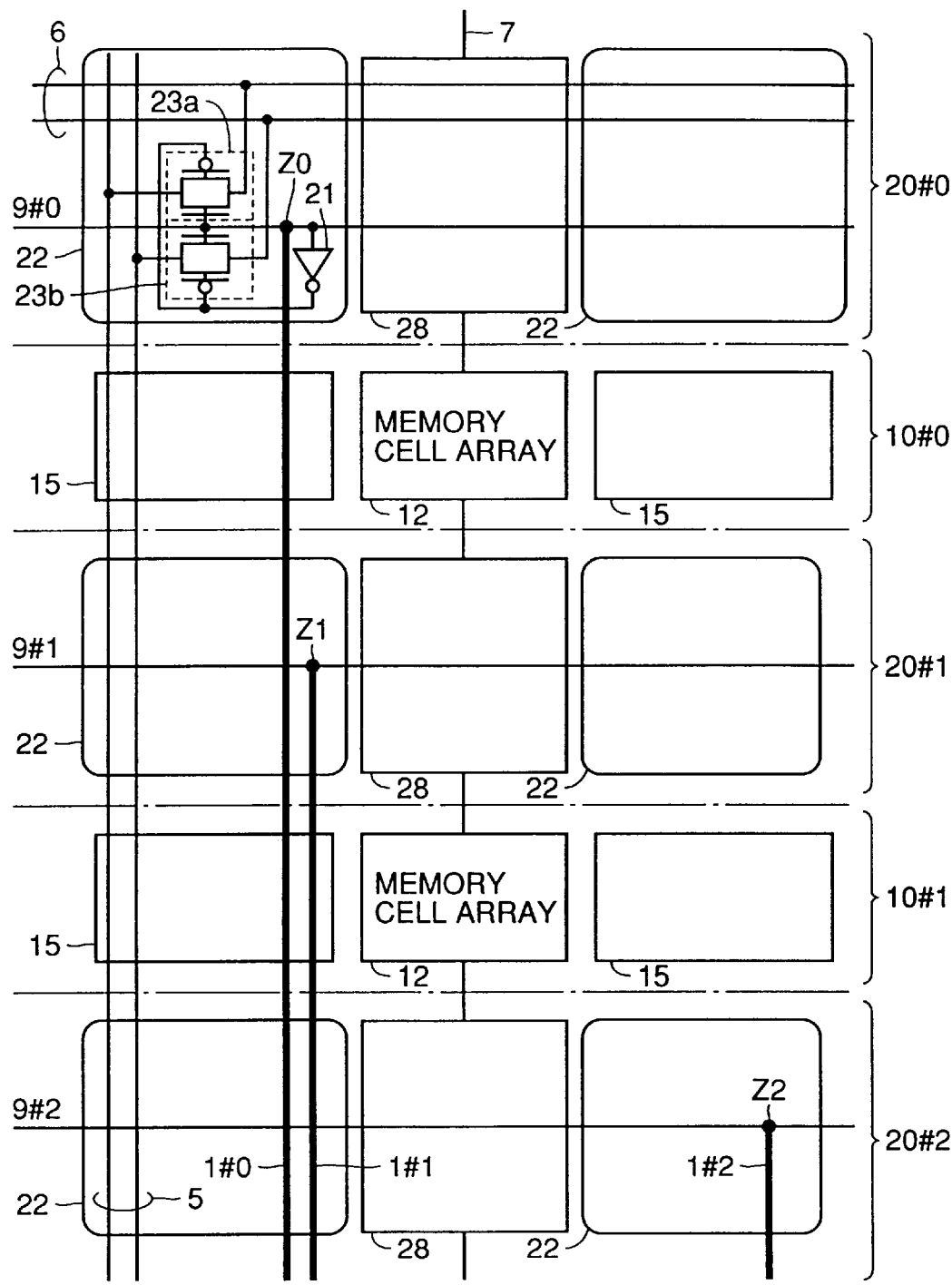
FIG. 2 shows an example of a specific configuration of a main part of semiconductor memory device 1000 shown in FIG. 1.

In FIG. 2, reference numbers 9#0, 9#1, 9#2 denote the transmission lines corresponding to sense amplifier bands 20#0, 20#1, 20#2. Further, reference number 28 denotes a circuit including a sense amplifier 26 and a sense amplifier-related switch circuit 24. The same elements as conventional semiconductor memory device 9000 are denoted by the same reference characters and numbers and their description will not be repeated.

As shown in FIG. 2, a local data input/output line 6 and transmission lines 9#0, 9#1, 9#2 are arranged in the row direction. On the contrary, a global data input/output line 5 and column bank control signal lines 1#0, 1#2, 1#3 are arranged vertically to the row direction, that is, in the column direction (parallel to a column selection line 7).

Column bank control signal line 1#0 is connected to transmission line 9#0 at a node Z0. Column bank control signal line 1#1 is connected to corresponding transmission line 9#1 at a node Z1. Column bank control signal line 1#2 is connected to corresponding transmission line 9#2 at a node Z2.

Data input/output-related switch circuits 22 and sense amplifier-related switch circuits included in circuits 28 are opened and closed in response to column bank control signals received from transmission lines 9#0, 9#1, . . . .

Column bank control signal lines 1#0, 1#1, . . . run on a dividing region 15 (periphery region including reference number 8 in FIG. 1) of memory cells. As a whole, the column bank control signals start from column bank control circuit 100 and run in a T shape manner.

Since such memory cell block that is separated from other blocks by the sense amplifier bands is regarded as one bank in the configuration in the first embodiment, seventeen column bank control signal lines run on dividing regions 15.

By thus arranging column bank control circuit 100 on the same side as column-related control circuit 102 (including a column decoder, a preamplifier circuit for amplifying data on the global data input/output lines, a write buffer circuit for controlling writing of data to memory cells, and so on), the operation timing of the column circuitry can be matched easily. Thus, higher speed of access to the column circuitry can be achieved.

Since the column bank control signal lines are directly connected to conventional transmission lines, an increase in the layout area of the circuit itself can be prevented.

Second Embodiment

Figure 3:
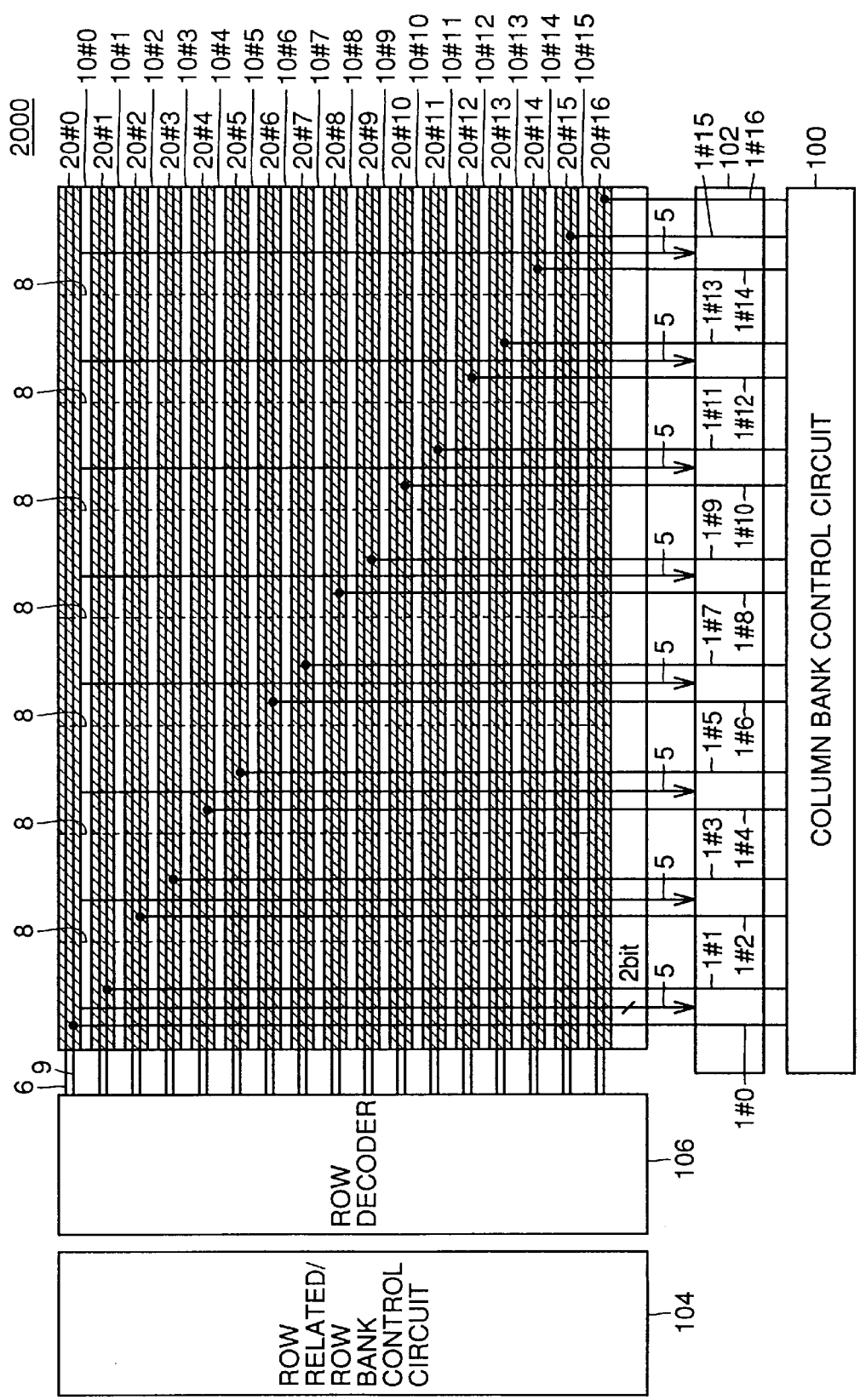
FIG. 3 shows a configuration of a main part of a semiconductor memory device 2000 in a second embodiment of the present invention.

A semiconductor memory device 2000 in a second embodiment of the present invention will be described with reference to FIG. 3.

A semiconductor memory device 2000 in the second embodiment of the present invention is different from semiconductor memory device 1000 in the fist embodiment in that the column bank control signal lines corresponding to the banks run on memory cell arrays in semiconductor memory device 2000.

The relations between transmission lines 9 and column bank control signal lines 1#0, . . . will be described in the following with reference to FIG. 4.

Figure 4:
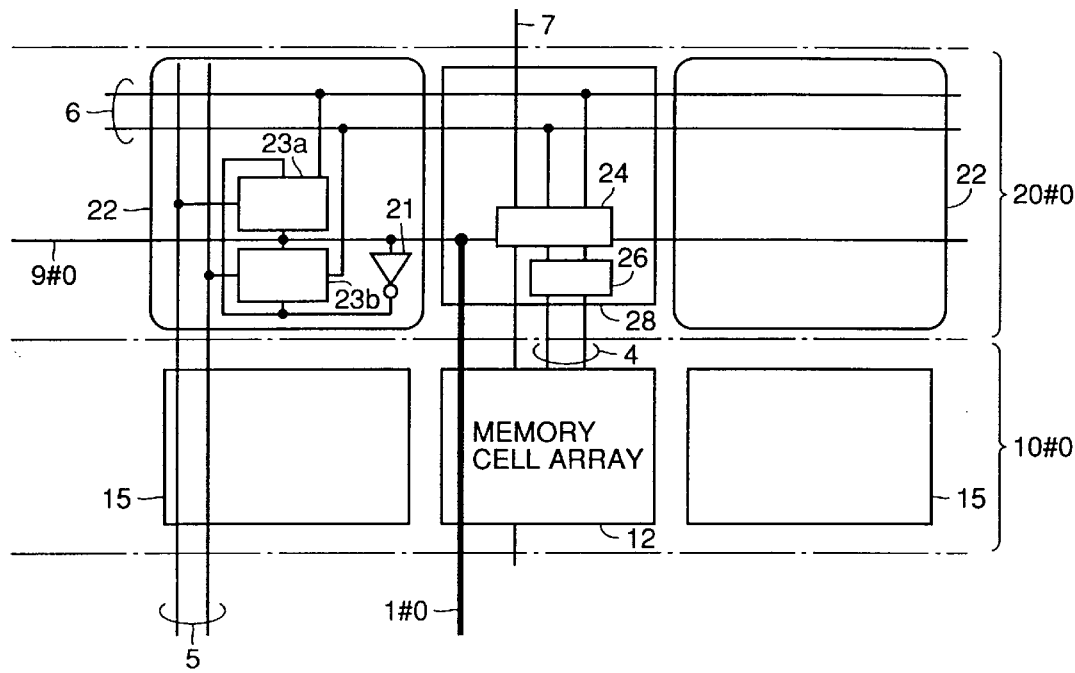
FIG. 4 shows an example of a specific configuration of a main part of semiconductor memory device 2000 shown in FIG. 3.

In FIG. 4, reference number 9#0 denotes a transmission line running through sense amplifier bank 20#0. The same elements as conventional semiconductor memory device 9000 are denoted by the same reference characters and numbers and their description will not be repeated.

As shown in FIG. 4, local data input/output line 6 and transmission line 9#0 are arranged in the row direction. On the contrary, global data input/output line 5 and column bank control signal line 1#0 are arranged vertically to the row direction, that is, in the column direction (parallel to column selection line 7). Column bank control signal line 1#0 and transmission line 9#0 are connected at a crossing area of the sense amplifier band and a series of memory cell arrays 12 in the column direction.

As in semiconductor memory device 1000, an area penalty is highly likely to be caused when ten-odd column bank control signal lines are arranged on dividing regions 15.

Although column selection line 7 and a power supply line for sense amplifiers generally run on memory cell arrays 12, an additional column bank control signal line can be provided easily without causing an area penalty.

Therefore, higher speed of a column-related operation can be achieved without an area penalty by such a configuration.

Third Embodiment

A semiconductor memory device in a third embodiment of the present invention will be described. The semiconductor memory device in the third embodiment of the present invention basically has the same configuration as semiconductor memory device 2000 shown in FIG. 3. Especially, in the semiconductor memory device in the third embodiment, ten-odd column bank control signal lines are arranged to pass through a column decoder.

Figure 5:
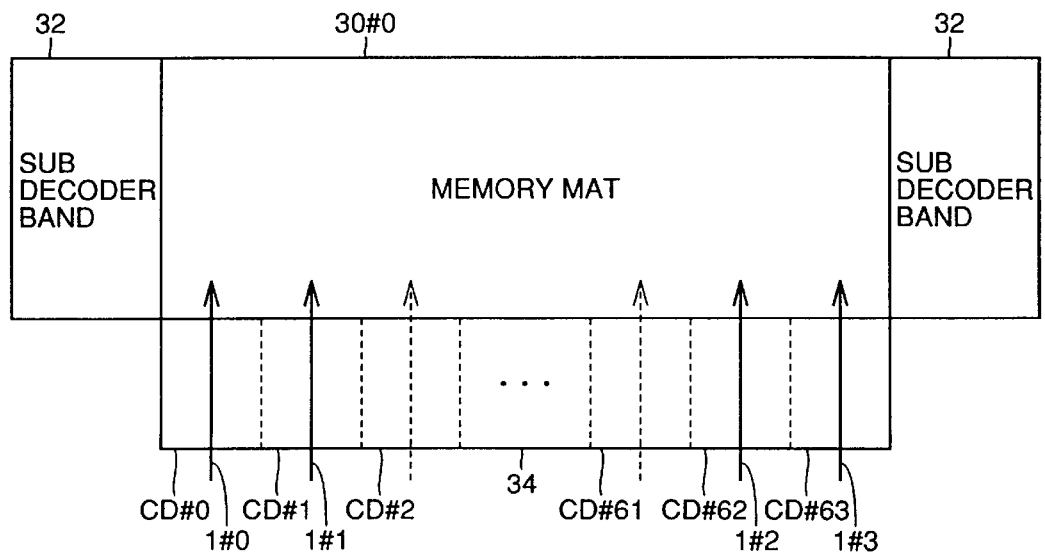
FIGS. 5 and 6 each show a specific configuration of a main part of a semiconductor memory device in a third embodiment of the present invention.

Specific configurations will be described in the following with reference to FIGS. 5 and 6. FIG. 5 shows an example of a specific configuration of a main part of the semiconductor memory device in the third embodiment of the present invention while FIG. 6 shows another example of the specific configuration for comparison.

Figure 6:
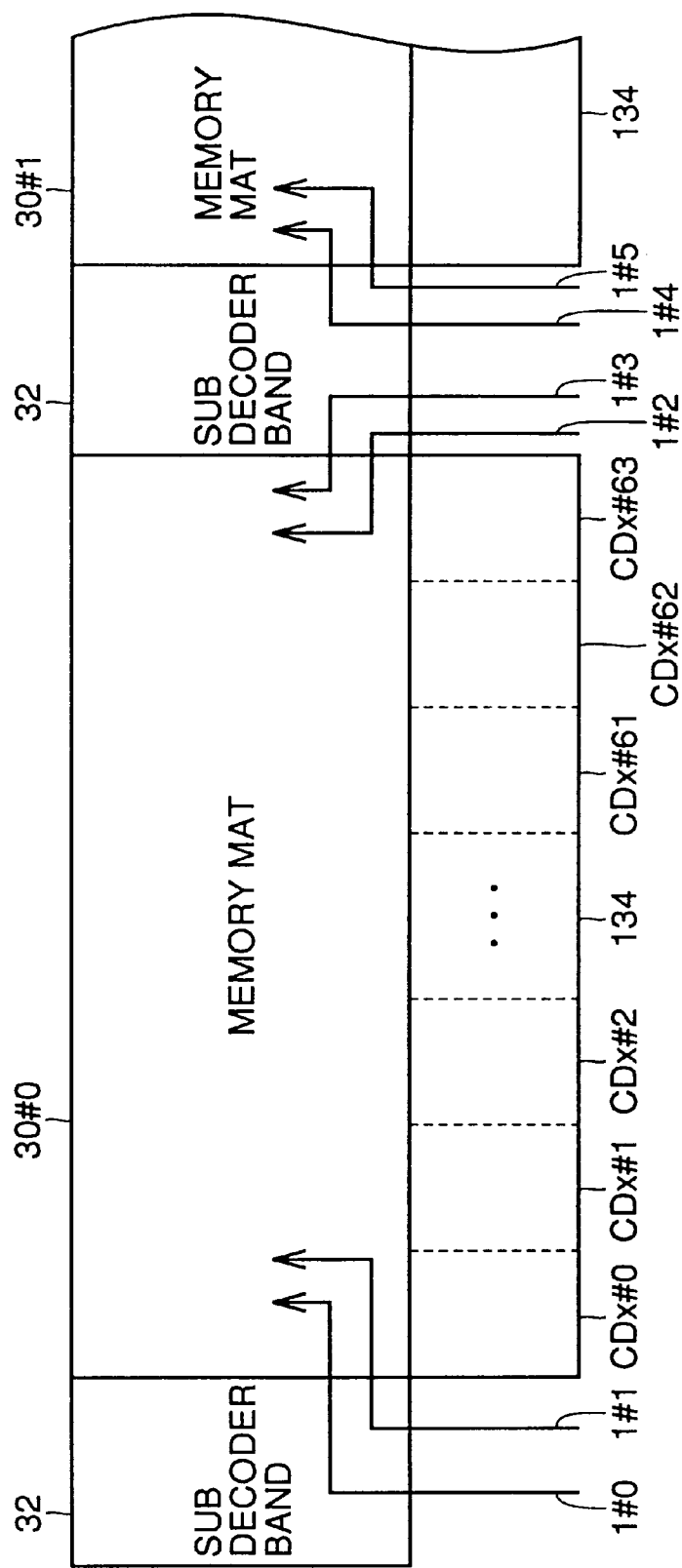

In FIGS. 5 and 6, reference numbers 30#0 and 30#1 denote memory mats, reference number 32 denotes a sub decode band, and reference numbers 34 and 134 denote column decoders.

Column decoder 134 shown in FIG. 6 includes a plurality of decode circuits CDx#0, CDx#1, CDx#2, . . . , CDx#61, CDx#62, CDx#63 (hereinafter, collectively denoted by CDx). These decode circuits CDx are used in conventional semiconductor memory device 9000 and regularly arranged at a prescribed memory cell pitch.

In order to implement the first and second embodiments, column bank control signal lines 1#0, 1#1, 2#2, . . . are passed, as an example, from regions where decode circuits CDx are not regularly arranged, that is, dividing regions represented by sub decode bands 32 to memory mats 30#0 and 30#1 as shown in FIG. 6.

On the contrary, in the third embodiment, the decode circuits are formed so that column bank control signal lines 1#0, 1#1, . . . pass through column decoder 34 as shown in FIG. 5.

Column decoder 34 shown in FIG. 5 includes a plurality of decode circuits CD#0, CD#1, CD#2, . . . , CD#61, CD#62, CD#63 (hereinafter, collectively denoted by CD). These decode circuits CD are laid out in advance so that aluminum interconnections can be passed through.

When four column bank control signal lines 1#0, 1#1, 1#2, 1#3 are arranged for one memory mat 30#0 as an example, column bank control signal lines 1#0, 1#1, 1#2, 1#3 are arranged by utilizing through interconnections in decode circuits CD#0, CD#1, CD#62, CD#63.

Here, the configuration is not limited to the one shown in FIG. 5 but column bank control signal lines 1#0, 1#1, 1#2, 1#3 can be arranged by utilizing a combination of the through interconnections in all decode circuits CD (the column bank control signal lines are passed through decode circuits CD at regular intervals, the lines are passed through one or more decode circuits CD at the center, and so on).

By thus laying out the column decoders in advance so that the column bank control signal lines can be passed through, higher speed of a column-related operation can be achieved without a larger area penalty.

Fourth Embodiment

A semiconductor memory device in a fourth embodiment of the present invention will be described. Since the transmission line for transmitting the column bank control signals has a considerable load as described above, skew is a conspicuous problem. In the first embodiment, the conventionally used transmission lines (arranged on the sense amplifier bands) and the column bank control signal lines are arranged in one to one correspondence.

In such a configuration, however, the operation timing of switch circuits (data input/output-related switch circuit and sense amplifier-related switch circuit) far from the connection node of a column bank control signal line and a transmission line may be delayed from the operation timing of switch circuits close to the connection node.

For example, column bank control signal lines 1#0, 1#1, 1#2, 1#14, 1#15, 1#16 in FIG. 1 are connected to the transmission lines at the ends of the memory mat. Compared with switch circuits near the connection node, therefore, arrival of the column bank control signals is delayed in the switch circuits near the other ends (farthest points) of the memory mat.

In the fourth embodiment of the present invention, skew caused in the row direction is suppressed by providing a plurality of column bank control signal lines for each transmission line.

A configuration of a semiconductor memory device 4000 in the fourth embodiment of the present invention will be described with reference to FIGS. 7 and 8. The same elements as semiconductor memory device 1000 are denoted by the same reference characters and numbers and their description will not be repeated.

Figure 7:
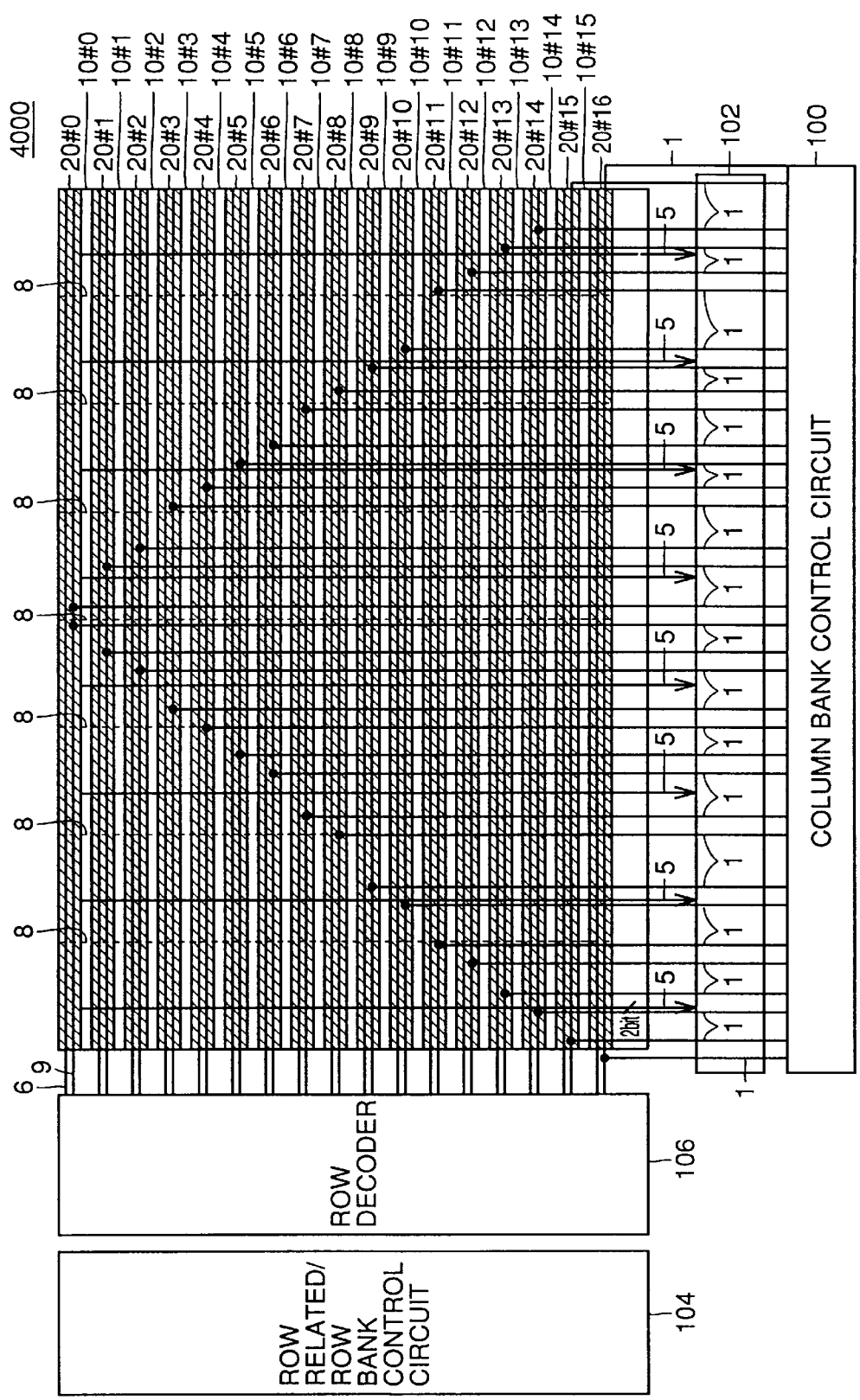
FIG. 7 shows a configuration of a main part of a semiconductor memory device 4000 in a fourth embodiment of the present invention.

In FIG. 7, reference number 1 denotes a column bank control signal line. As shown in FIG. 7, two column bank control signal lines are arranged in the column direction for each transmission line 9 arrange in the row direction in semiconductor memory device 4000.

Figure 8:
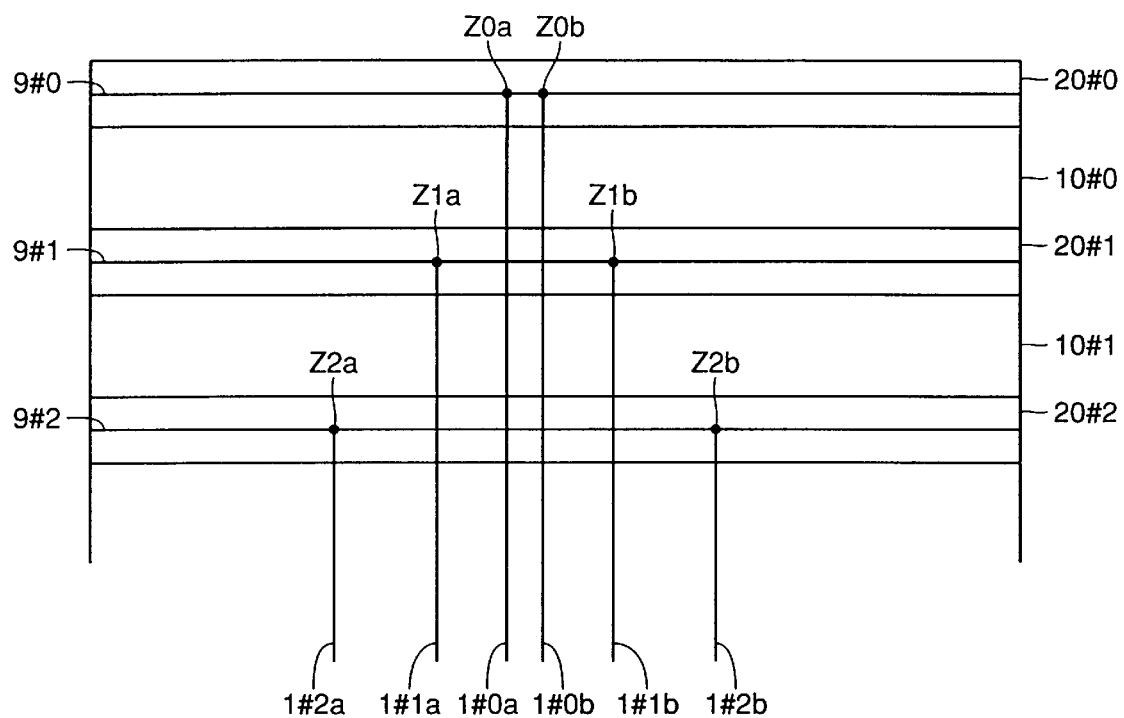
FIG. 8 shows an example of a specific configuration of a main part of semiconductor memory device 4000 shown in FIG. 7.

In FIG. 8, reference characters 1#0a, 1#0b, 1#1a, 1#1b, 1#2a, 1#2b denote column bank control signal lines. Reference numbers 9#0, 9#1, 9#2, denote transmission lines.

Referring to FIG. 8, column bank control signal lines 1#0a and 1#0b are arranged for transmission line 9#0 in sense amplifier bank 20#0. Column bank control signal lines 1#0a and 1#0b are connected to transmission line 9#0 at nodes Z0a and Z0b.

Column bank control signal lines 1#1*a* and 1#1*b* are arranged for transmission line 9#1 in sense amplifier bank 20#1. Column bank control signal lines 1#1*a* and 1#1*b* are connected to transmission line 9#1 at nodes Z1*a* and Z1*b*. Similarly, column bank control signal lines 1#2*a* and 1#12*b* are connected to transmission line 9#2 at nodes Z2*a* and Z2*b*.

According to a configuration, the timing at which the column bank control signal reaches each switch circuit is faster than when the column bank control signal lines and the transfer lines are arranged in one to one correspondence. Thus, delay in the operation timing of the switch circuits arranged in the row direction can be suppressed.

Although the case where the transmission lines and the column bank control signal lines are arranged in one to two correspondence was described, the transmission lines and the column bank control signal lines may be arranged in one to n (n≧3) correspondence.

Here, the column bank control signal lines running in the column direction extend on the memory cell arrays, the dividing regions, or the memory cell arrays and the dividing regions.

Fifth Embodiment

A semiconductor memory device in a fifth embodiment of the present invention will be described. In the fourth embodiment, a plurality of column bank control signal lines running in the column direction are arranged for each transmission line in the sense amplifier bank. However, skew is still caused in the row direction when a plurality of column bank control signal lines running in the column direction are only arranged for each transmission line.

In the configuration shown in FIGS. 7 and 8, for example, the operation timing of the switch circuits at the both ends of a sense amplifier band is delayed (the operation timing is varied) from the operating timing of the switch circuits near the center in sense amplifier bands 20#0. In sense amplifier band 20#16, the operation timing of the switch circuits at the center is delayed from the operation timing of the switch circuits at the both ends of the sense amplifier band. In the fifth embodiment of the present invention, the column bank control signal lines are arranged so as to further suppress skew in the row direction.

A configuration of a semiconductor memory device 5000 in the fifth embodiment of the present invention will be described with reference to FIGS. 9 and 10. The same elements as semiconductor memory devices 1000 to 4000 are denoted by the same reference characters and numbers and their description will not be repeated.

Figure 9:
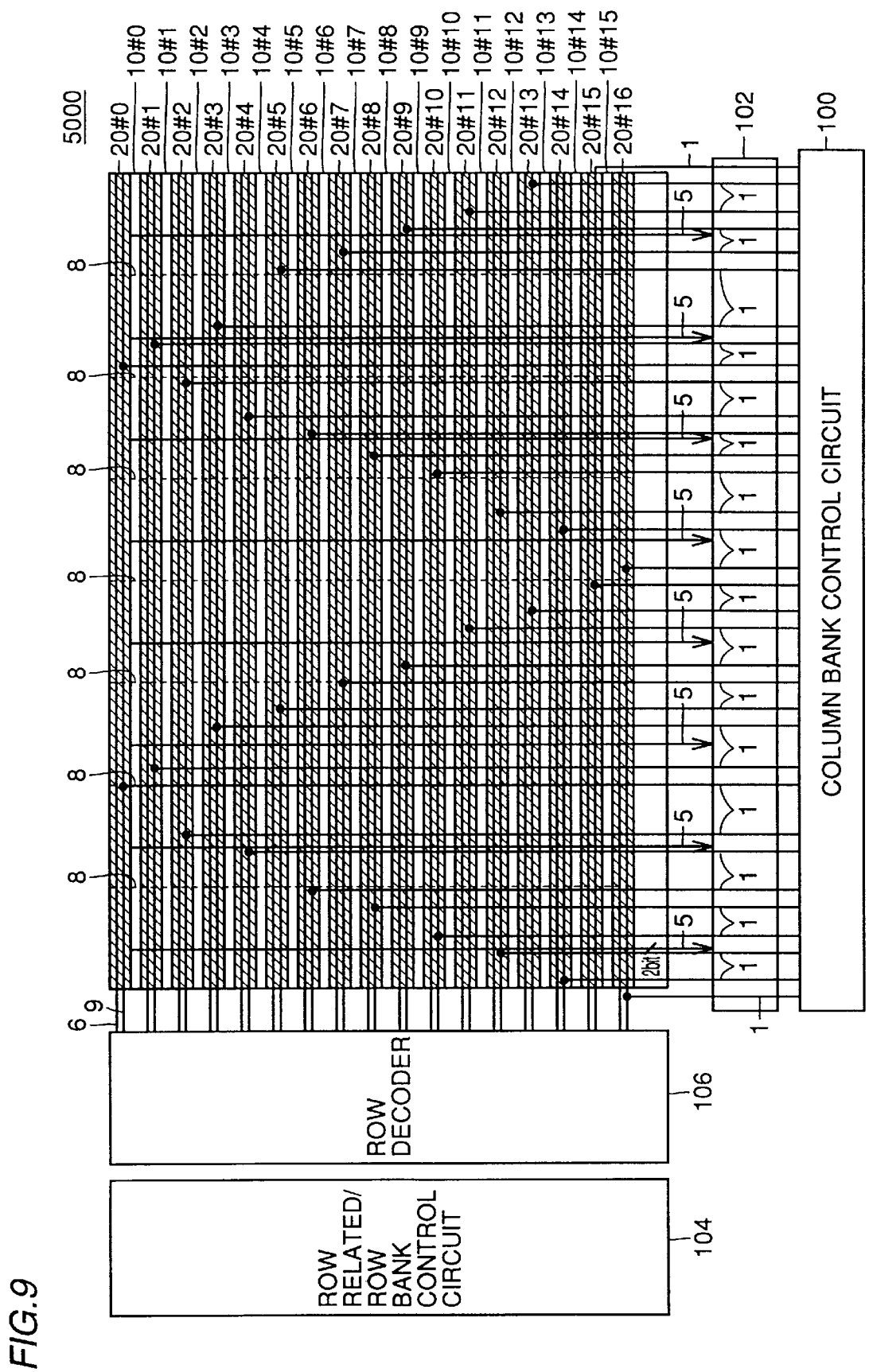
FIG. 9 show a configuration of a main part of a semiconductor memory device 5000 in a fifth embodiment of the present invention.

In FIG. 9, reference number 1 denotes a column bank control signal line. As shown in FIG. 9, two column bank control signal lines are arranged in the column direction for each transmission line 10 arranged in the row direction in semiconductor memory device 5000. In this regard, this embodiment is the same as the fourth embodiment. However, this embodiment is different from the fourth embodiment in that transmission line 9 and two column bank control signal lines are connected to further suppress skew in the row direction as shown in FIG. 10.

Figure 10:
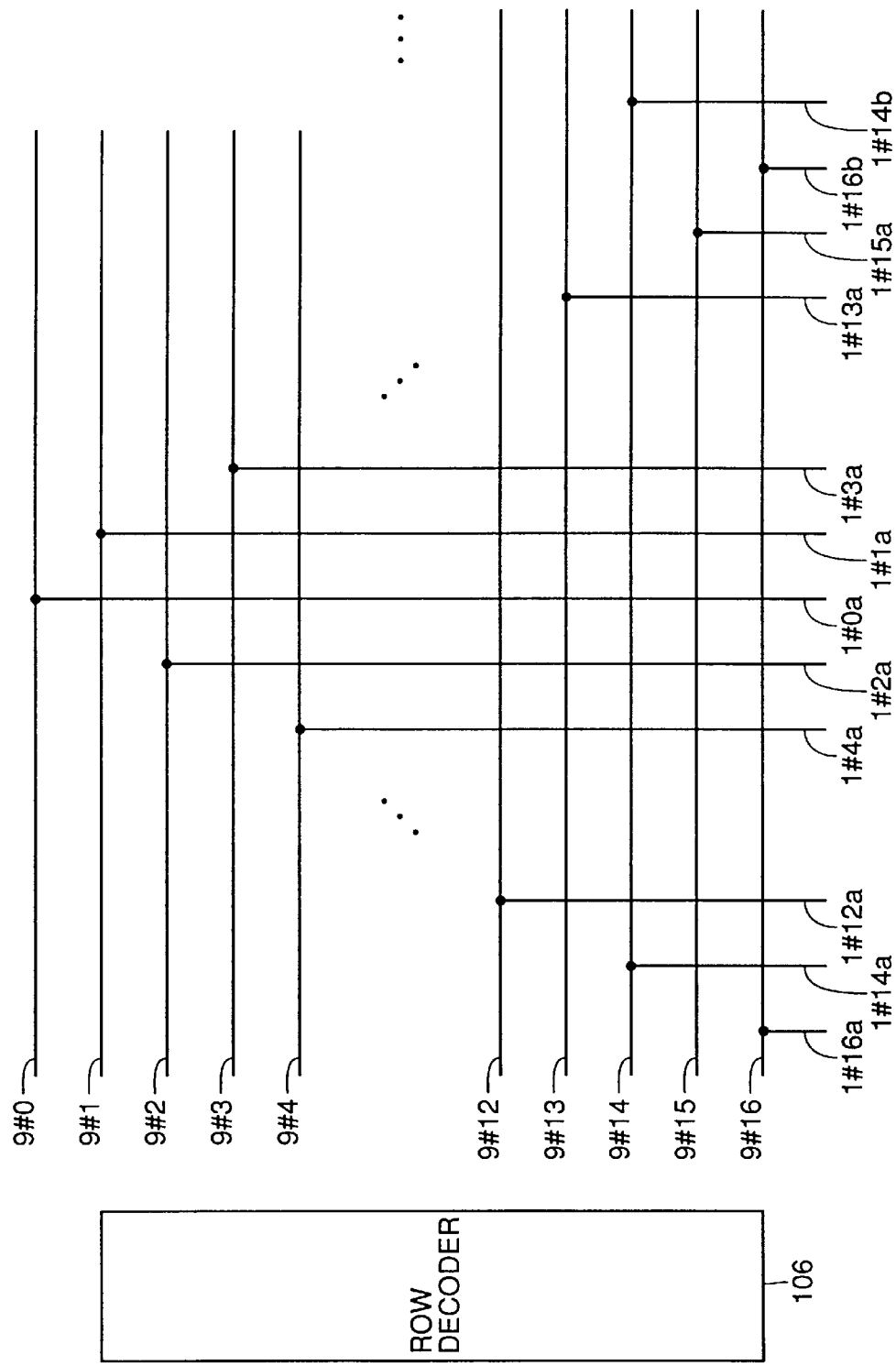
FIG. 10 shows an example of a specific configuration of a main part of semiconductor memory device 5000 shown in FIG. 9.
Figure 11:
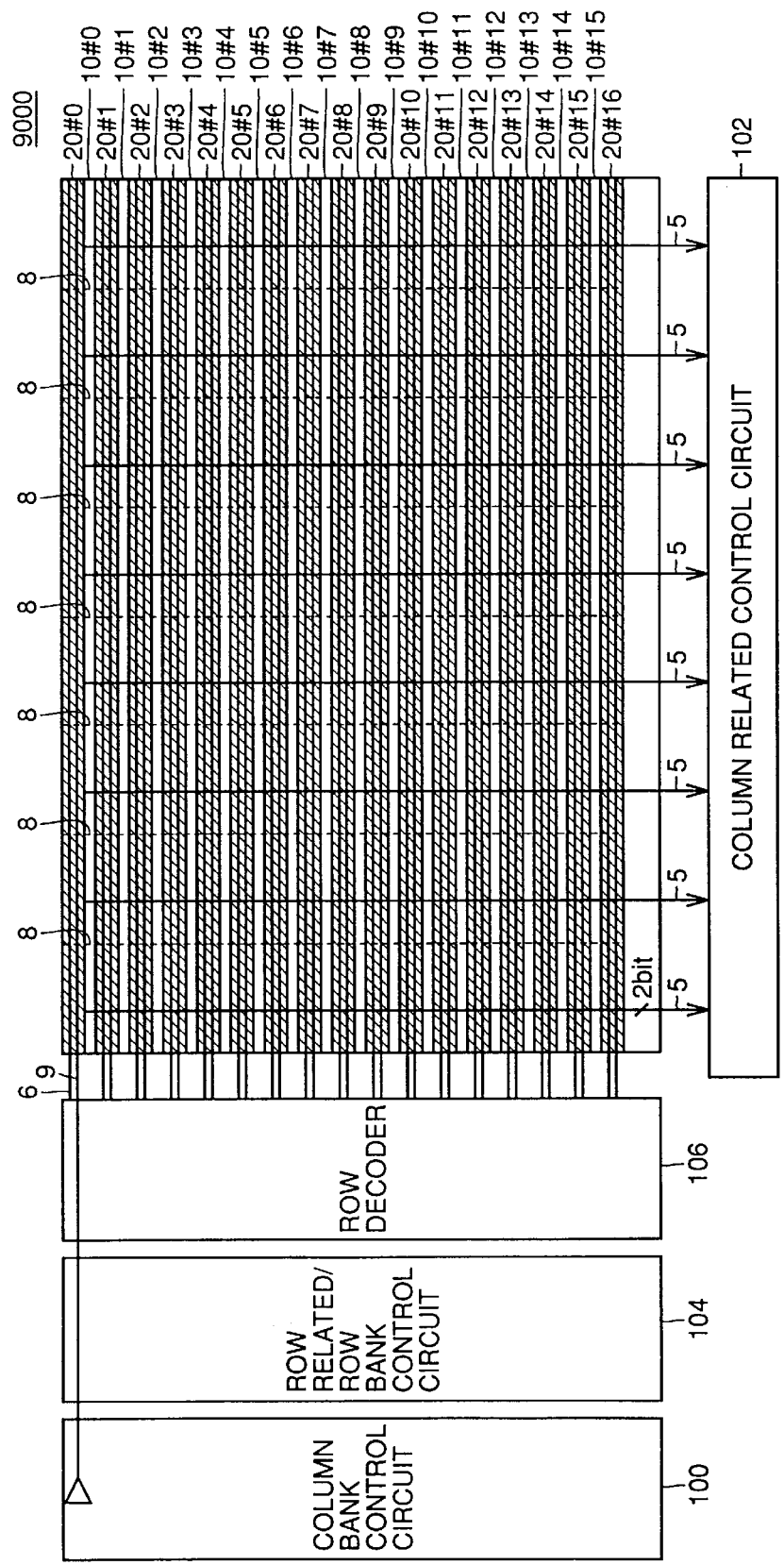
FIG. 11 shows an example of a configuration of a main part of a conventional semiconductor memory device 9000.
Figure 12:
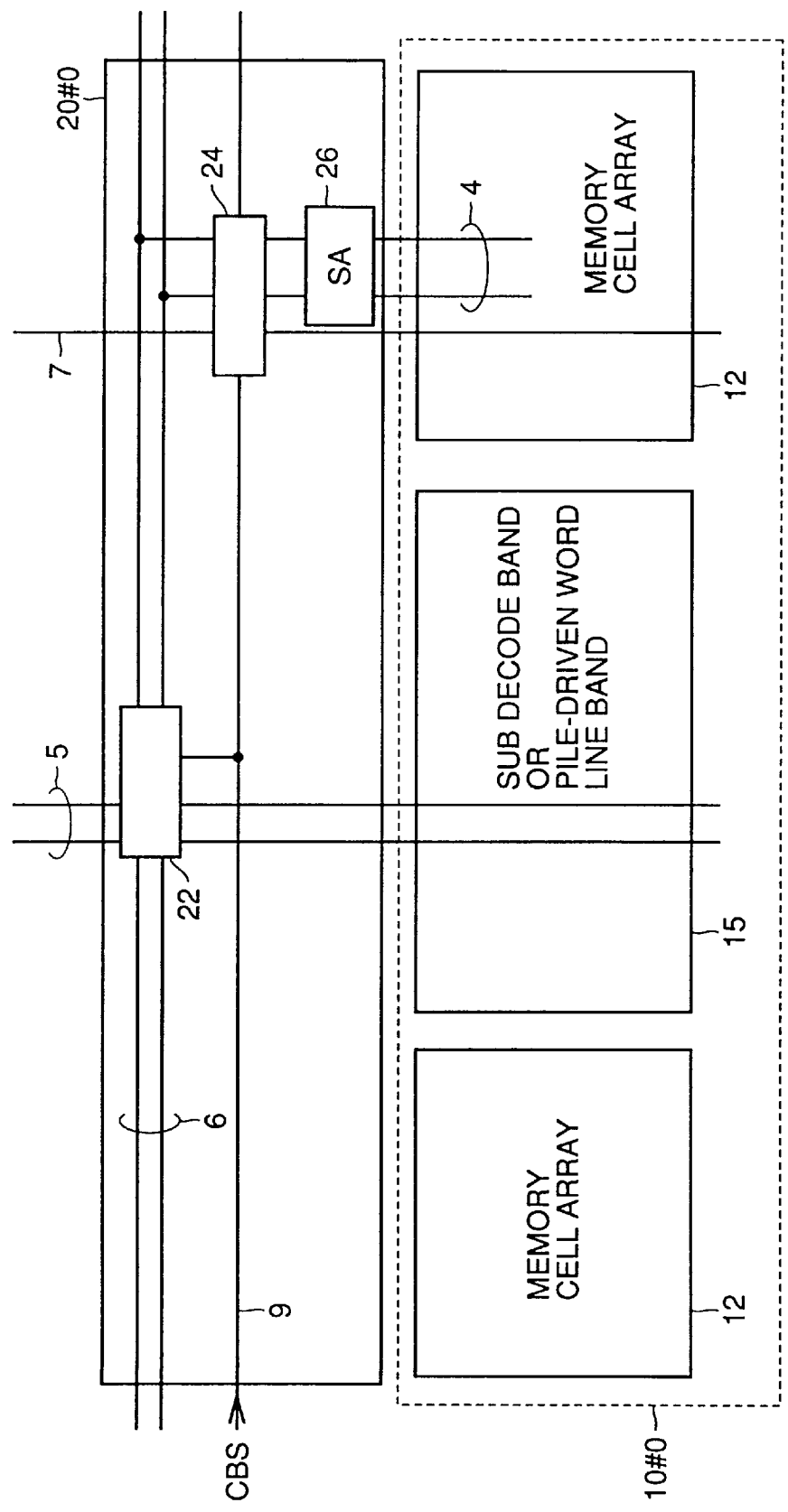
FIG. 12 illustrates a configuration of a bank and a sense amplifier band in conventional semiconductor memory device 9000.
Figure 13:
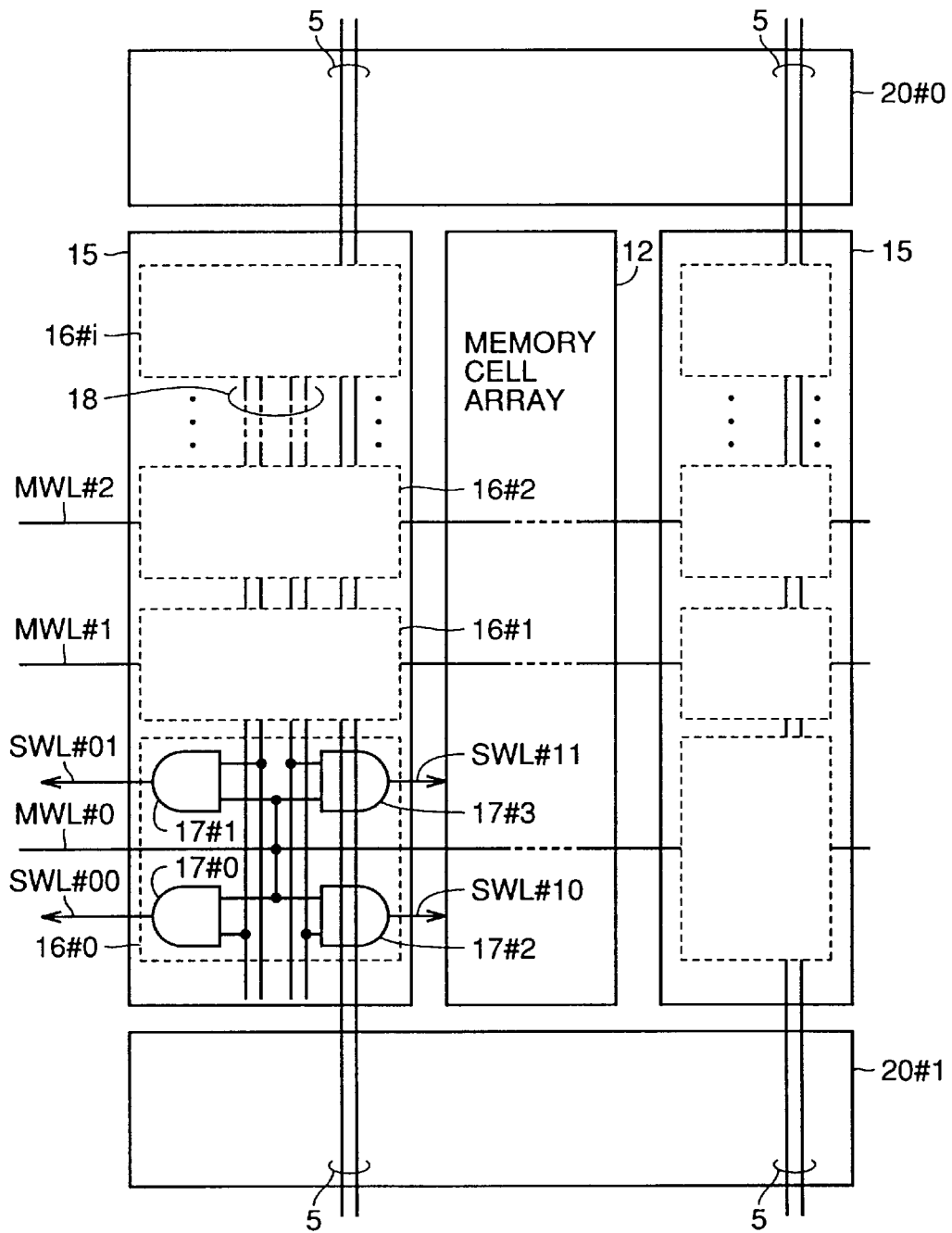
FIG. 13 shows a specific configuration of a sub decode bank.
Figure 14:
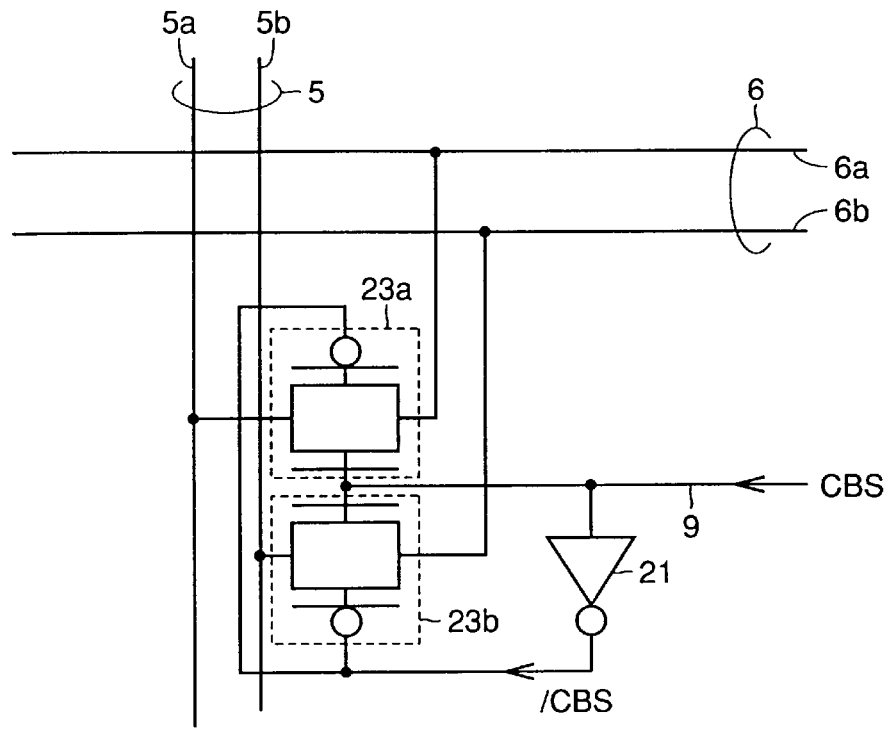
FIG. 14 is a circuit diagram showing a specific configuration of a data input/output-related switch circuit 22.
Figure 15:
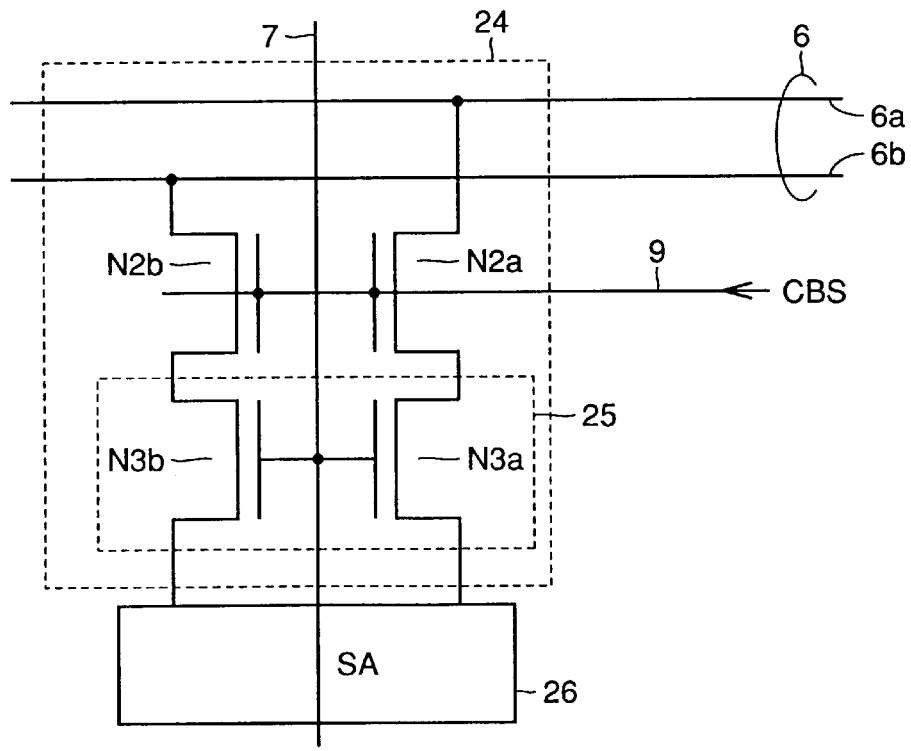
FIG. 15 illustrates a specific configuration of a sense amplifier-related switch circuit 24.

In FIG. 10, reference characters 1#0*a*, 1#1*a*, 1#2*a*, 1#3*a*, 1#4*a*, 1#12*a*, 1#13*a*, 1#14*a*, 1#15*a*, 1#16*a*, 1#14*b*,1π16*b* denote column bank control signal lines. Reference numbers 9#0, 9#1, 9#2, 9#3, 9#4, 9#12, 9#13, 9#14, 9#15, 9#16 denote transmission lines.

Referring to FIG. 10, column bank control signal lines 1#16*a*, 1#14*a*, 1#12*a*, . . . , 1#4*a*, 1#2*a*, 1#0*a*, 1#1*a*, 1#3*a*, . . . , 1#15*a* are arranged in this order from the side of row decoder 106 for transmission lines 9#16, 9#14, 9#12, . . . , 9#4, 9#2, 9#0, 9#1, 9#3, . . . , 9#13, 9#15. Further, column bank control signal lines 1#16*b*, 1#14*b* . . . are arranged in this order for transmission lines 9#16, 9#14, . . .

In this manner, adjacent column bank control signal lines are arranged every second bank from the end of the memory mat on semiconductor memory device 5000. The column bank control signal lines at the both ends of the memory mat have shorter length.

Specifically, column bank control signal line 1#16*a* and transmission line 9#16 corresponding to sense amplifier bank 20#16 (bank 10#15) are connected at the end of the memory mat.

Therefore, for the banks (10#0, 10#1, . . . ) far from column-related control circuit 102, the connection nodes of the column bank control signal lines and the transmission lines are arranged uniformly on the memory mat. Thus, skew in the row direction can be suppressed.

For the banks (10#15, 10#14, . . . ) close to column-related control circuit 102, the length of the column bank control signal lines is shorter and therefore the speed of signal transmission is made faster. Thus, skew in the row direction is improved compared with the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of banks each divided to form a plurality of memory cell arrays corresponding to a plurality of columns;
    a plurality of sense amplifier blocks arranged corresponding to said plurality of banks;
    a plurality of data lines arranged in a column direction, said plurality of data lines each provided commonly to a corresponding one of said columns in said plurality of banks;
    a plurality of column selection lines arranged in the column direction, said plurality of column selection lines each provided to select a corresponding one of said columns in said plurality of banks;
    said plurality of sense amplifier blocks each including
        a plurality of sense amplifiers arranged corresponding to said plurality of columns,
        a transmission line arranged in a row direction, and
        a plurality of control means for controlling transmission of outputs of said plurality of sense amplifiers to corresponding ones of said data lines in response to a signal on said transmission line;
    column bank control means for generating a control signal to be supplied to a plurality of said transmission lines; and
    a plurality of control signal lines arranged in the column direction, said plurality of control signal lines each supplying said control signal output from said column bank control means to a corresponding one of said transmission lines.

2. The semiconductor memory device according to claim 1, wherein
    said plurality of control signal lines are connected to corresponding ones of said transmission lines in corresponding ones of said sense amplifier blocks.

3. The semiconductor memory device according to claim 2, wherein
said plurality of banks each further include a plurality of dividing areas arranged corresponding to said plurality of columns, and
said plurality of control signal lines are arranged on said plurality of dividing areas arranged in the column direction.

4. The semiconductor memory device according to claim 2, wherein
said plurality of control signal lines are arranged on a plurality of said memory cell arrays arranged in the column direction.

5. The semiconductor memory device according to claim 2, further comprising a column decoder for controlling activation in the column direction in said plurality of banks, wherein
said column bank control means and said column decoder are arranged parallel to a series of said plurality of banks.

6. The semiconductor memory device according to claim 5, wherein
said column decoder includes a plurality of decode circuits,
said plurality of decode circuits each include a region formed in the column direction for passing one of said plurality of control signal lines, and
said plurality of control signal lines are arranged on a plurality of said memory cell arrays arranged in the column direction through a plurality of said regions in said plurality of decode circuits.

7. The semiconductor memory device according to claim 1, wherein
said plurality of control signal lines each include a plurality of signal lines for supplying a corresponding said control signal to a corresponding one of said transmission lines, and
said plurality of signal lines are each connected at prescribed intervals to a corresponding one of said transmission lines.

8. The semiconductor memory device according to claim 7, wherein
said plurality of banks each further include a plurality of dividing areas arranged corresponding to said plurality of columns, and
said plurality of signal lines in said plurality of control signal lines are arranged on a plurality of said dividing areas in the column direction.

9. The semiconductor memory device according to claim 7, wherein
said plurality of signal lines in said plurality of control signal lines are arranged on a plurality of said memory cell arrays arranged in the column direction.

10. The semiconductor memory device according to claim 1, wherein
said plurality of control signal lines each include a plurality of signal lines for supplying a corresponding control signal to a corresponding one of said transmission lines, and
said plurality of signal lines are connected to corresponding ones of said transmission lines so that arrival timing of said control signals for said plurality of control means is substantially uniform.

11. The semiconductor memory device according to claim 10, wherein
said plurality of banks each further include a plurality of dividing areas arranged corresponding to said plurality of columns, and
said plurality of signal lines in said plurality of control signal lines are arranged on a plurality of said dividing areas in the column direction.

12. The semiconductor memory device according to claim 10, wherein
said plurality of signal lines in said plurality of control signal lines are arranged on a plurality of said memory cell arrays arranged in the column direction.

13. The semiconductor memory device according to claim 1, wherein
said plurality of control signal lines each include a plurality of signal lines for supplying a corresponding said control signal to a corresponding one of said transmission line, and
said plurality of signal lines are connected to corresponding ones of said transmission lines so as to suppress delay in operation timing of said plurality of control means.

14. The semiconductor memory device according to claim 13, wherein
said plurality of banks each further include a plurality of dividing areas arranged corresponding to said plurality of columns, and
said plurality of signal lines in said plurality of control signal lines are arranged on a plurality of said dividing areas arranged in the column direction.

15. The semiconductor memory device according to claim 13, wherein
said plurality of signal lines in said plurality of control signal lines are arranged on a plurality of said memory cell arrays arranged in the column direction.

* * * * *